United States Patent
Hosseini et al.

(10) Patent No.: US 9,263,369 B2
(45) Date of Patent: Feb. 16, 2016

(54) CHIP ARRANGEMENT, WAFER ARRANGEMENT AND METHOD OF MANUFACTURING THE SAME

(71) Applicant: Infineon Technologies Austria AG, Villach (AT)

(72) Inventors: Khalil Hosseini, Weihmichl (DE); Anton Mauder, Kolbermoor (DE); Joachim Mahler, Regensburg (DE)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 21 days.

(21) Appl. No.: 13/835,227

(22) Filed: Mar. 15, 2013

(65) Prior Publication Data

US 2014/0264919 A1 Sep. 18, 2014

(51) Int. Cl.
| | |
|---|---|
| *H01L 21/56* | (2006.01) |
| *H01L 23/48* | (2006.01) |
| *H01L 21/768* | (2006.01) |
| *H01L 25/07* | (2006.01) |
| *H01L 25/18* | (2006.01) |
| *H01L 29/66* | (2006.01) |
| *H01L 29/739* | (2006.01) |
| *H01L 29/861* | (2006.01) |

(52) U.S. Cl.
CPC ........ *H01L 23/481* (2013.01); *H01L 21/76898* (2013.01); *H01L 25/074* (2013.01); *H01L 25/18* (2013.01); *H01L 29/66333* (2013.01); *H01L 29/7398* (2013.01); *H01L 29/861* (2013.01); *H01L 2224/0603* (2013.01); *H01L 2224/32245* (2013.01); *H01L 2224/48247* (2013.01); *H01L 2224/48472* (2013.01); *H01L 2224/4903* (2013.01); *H01L 2224/49111* (2013.01); *H01L 2224/49113* (2013.01); *H01L 2224/73265* (2013.01); *H01L 2924/0002* (2013.01); *H01L 2924/13055* (2013.01)

(58) Field of Classification Search
CPC . H01L 21/56; H01L 23/3121; H01L 23/3677; H01L 23/49877; H01L 23/5389; H01L 24/24; H01L 24/27; H01L 24/29; H01L 24/82; H01L 25/16; H01L 24/32; H01L 25/071; H01L 25/074; H01K 1/185
See application file for complete search history.

(56) References Cited

U.S. PATENT DOCUMENTS

| | | | | |
|---|---|---|---|---|
| 2011/0108971 | A1* | 5/2011 | Ewe et al. | 257/686 |
| 2012/0025355 | A1* | 2/2012 | Sasaki et al. | 257/620 |
| 2012/0292757 | A1 | 11/2012 | Mauder et al. | |

* cited by examiner

*Primary Examiner* — David Vu
*Assistant Examiner* — Mouloucoulaye Inoussa

(57) ABSTRACT

Various embodiments provide a chip arrangement. The chip arrangement may include a first chip having a first chip side and a second chip side opposite the first chip side and at least one contact on its second chip side; a second chip having a first chip side and a second chip side opposite the first chip side and at least one contact on its first chip side; wherein the second chip side of the first chip and the second chip side of the second chip are facing each other; a first electrically conductive structure extending from the at least one contact of the first chip from the second chip side of the first chip through the first chip to the first chip side of the first chip; and a second electrically conductive structure.

27 Claims, 14 Drawing Sheets

CHIP ARRANGEMENT, WAFER ARRANGEMENT AND METHOD OF MANUFACTURING THE SAME

TECHNICAL FIELD

Various embodiments relate generally to a chip arrangement, a wafer arrangement and a method of manufacturing the same.

BACKGROUND

Power semiconductor components can be encapsulated or packaged with an organic polymer material, press mass or a laminate on component level.

In some conventional approaches, a semiconductor component (device) is packaged with an inorganic or organic carrier material or a cover (lid) material, which is simultaneously used for passivation and hermetic sealing. However, the encapsulation using a polymer material may result in a high moisture reception and a coefficient of thermal expansion (CTE) which is not adjusted to the semiconductor device. This may cause reliability problems during operation.

The combination of various electrically active structure is realized by doping, re-distributing and patterning of one single silicon wafer.

FIG. 1 shows a diagram 100, in which a circuit 110 is realized in a leadframe package 120 having two separated semiconductor devices, e.g. an IGBT (insulated gate bipolar transistor) 102 and a diode 104, which have been contacted with each other using conventional bonding techniques.

SUMMARY

Various embodiments provide a chip arrangement. The chip arrangement may include a first chip having a first chip side and a second chip side opposite the first chip side and at least one contact on its second chip side; a second chip having a first chip side and a second chip side opposite the first chip side and at least one contact on its first chip side; wherein the second chip side of the first chip and the second chip side of the second chip are facing each other; a first electrically conductive structure extending from the at least one contact of the first chip from the second chip side of the first chip through the first chip to the first chip side of the first chip; and a second electrically conductive structure extending from the at least one contact of the second chip from the first chip side of the second chip through the second chip and through the first chip to the first chip side of the first chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 2:
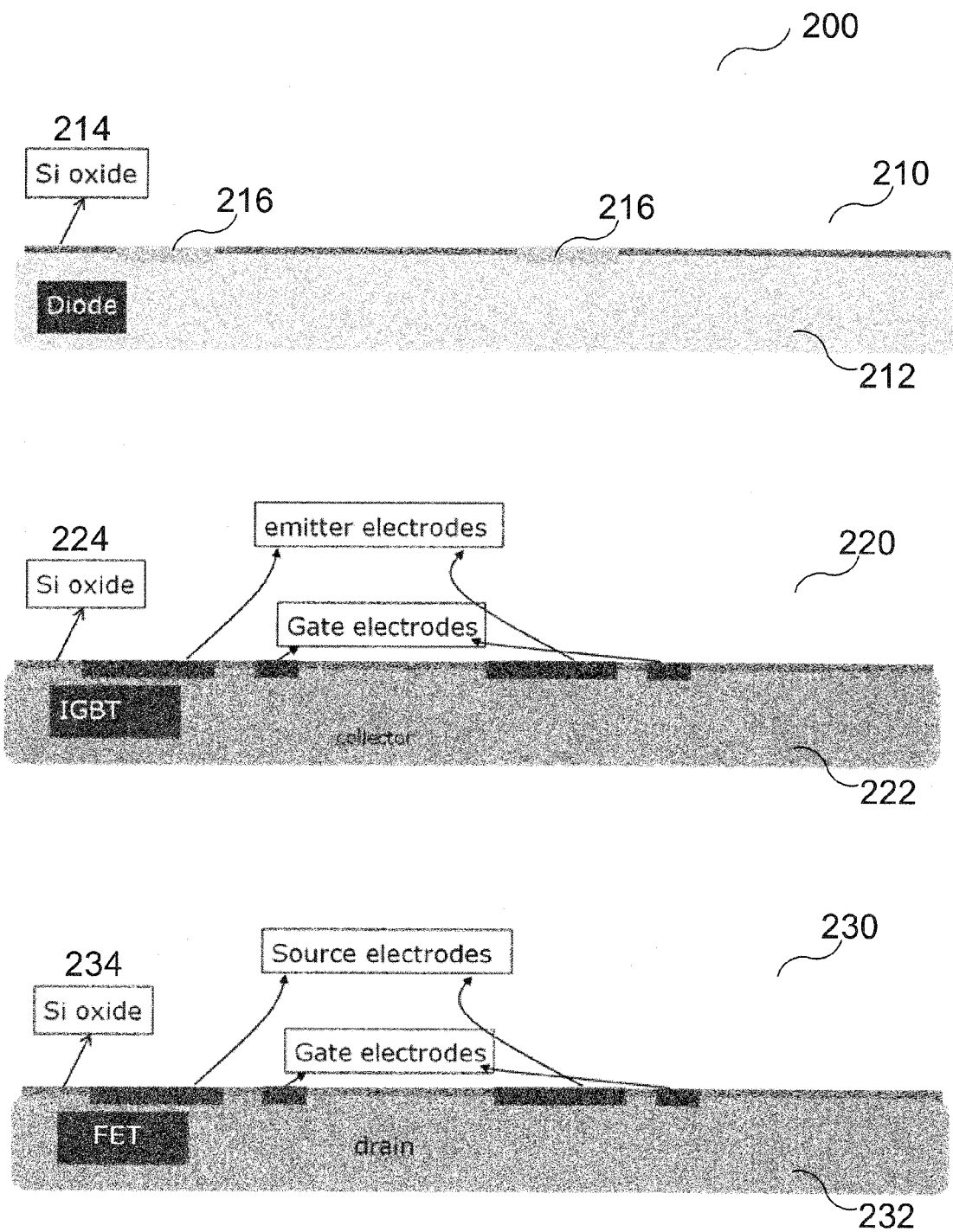
FIG. 2 shows a diagram illustrating a plurality of chip structure.

FIG. 2 shows a diagram 200 illustrating a plurality of chip structure.

A diode wafer 210 may have a plurality of diodes therein, wherein two diodes are shown in FIG. 2. The diodes may be formed in a semiconductor substrate 212, e.g. a silicon substrate, on which electrical contacts 216 of the diodes may be formed. The semiconductor substrate 212 may be covered with a layer of insulating material 214, e.g. a silicon oxide layer 214, to insulate the electrical contacts 216 from each other. The diode wafer 210 may be singularized into a plurality of diode chips.

An IGBT (insulated gate bipolar transistor) wafer 220 may have one or a plurality of IGBTs therein, wherein two IGBTs are shown in FIG. 2. The IGBTs may be formed in a semiconductor substrate 222, e.g. a silicon substrate, on which electrical contacts of the IGBTs, e.g. gate electrodes and emitter electrodes, may be formed. Electrical contacts of the IGBTS, e.g. collector electrodes, may also be formed within the semiconductor substrate 222, e.g. by doping. The semiconductor substrate 222 may be covered with a layer of insulating material 224, e.g. a silicon oxide layer 224, to insulate the gate electrodes and emitter electrodes from each other. The IGBT wafer 220 may be singularized into a plurality of IGBT chips.

A FET (field effect transistor) wafer 230 may have one or a plurality of FETs therein, wherein two FETs are shown in FIG. 2. The FETs may be formed in a semiconductor substrate 232, e.g. a silicon substrate, on which electrical contacts of the FETs, e.g. gate electrodes and source electrodes, may be formed. Electrical contacts of the FETS, e.g. drain electrodes, may also be formed within the semiconductor substrate 232, e.g. by doping. The semiconductor substrate 232 may be covered with a layer of insulating material 234, e.g. a silicon oxide layer 234, to insulate the gate electrodes and source electrodes from each other. The FET wafer 230 may be singularized into a plurality of FET chips.

According to various embodiments, a chip arrangement may be provided including two or more chips or wafers, e.g. the various chips or wafers shown in FIG. 2 above.

Figure 3:
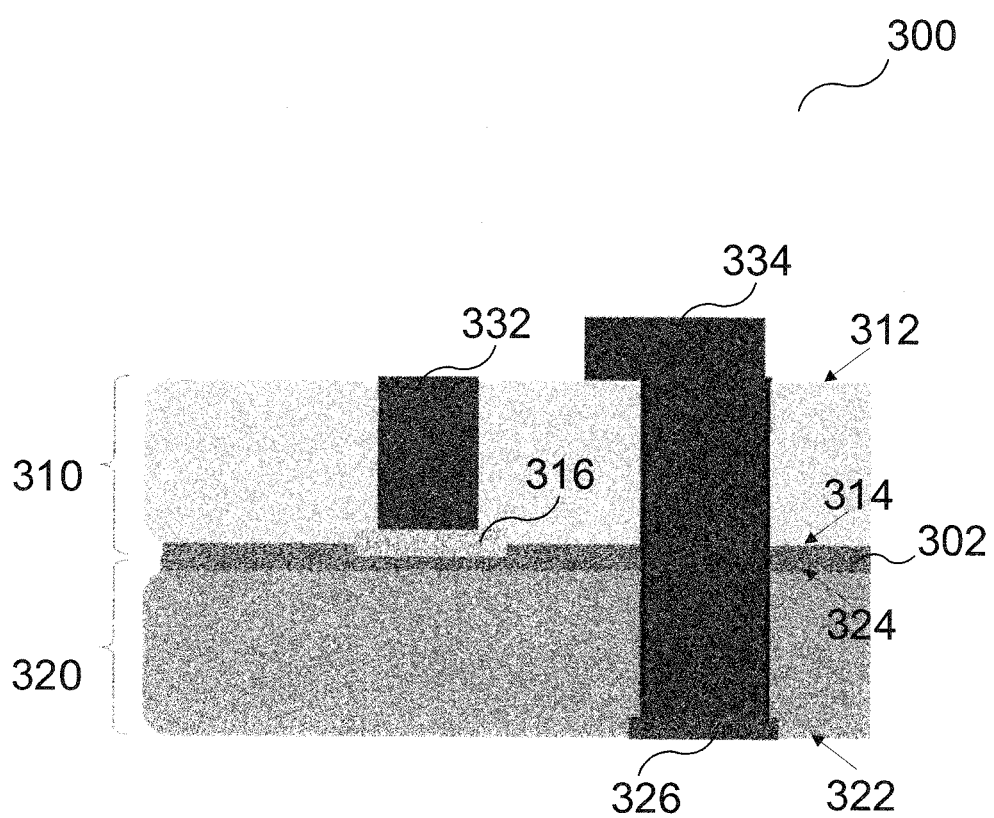
FIG. 3 shows a chip arrangement according to various embodiments.

FIG. 3 shows a chip arrangement 300 according to various embodiments.

The chip arrangement 300 may include a first chip 310 and a second chip 320. The first chip 310 may have a first chip (main) side 312 and a second chip (main) side 314 opposite the first chip (main) side 312, and at least one contact 316 on its second chip (main) side 314. The second chip 320 may have a first chip (main) side 322 and a second chip (main) side 324 opposite the first chip (main) side 322, and at least one contact 326 on its first chip (main) side 322. The second chip (main) side 314 of the first chip 310 and the second chip (main) side 324 of the second chip 320 may face each other.

The chip arrangement 300 may include a first electrically conductive structure 332 extending from the at least one contact 316 of the first chip 310 from the second chip side 314 of the first chip 310 through the first chip 310 to the first chip side 312 of the first chip 310. The chip arrangement 300 may further include a second electrically conductive structure 334 extending from the at least one contact 326 of the second chip 320 from the first chip side 322 of the second chip 320 through the second chip 320 and through the first chip 310 to the first chip side 312 of the first chip 310.

In various embodiments, the first electrically conductive structure 332 may extend through via holes through the first chip 310, wherein the sidewalls of the via holes may be covered by an insulating layer. In various embodiments, the second electrically conductive structure 334 may extend through via holes through the first chip 310 and the second chip 320, wherein the sidewalls of the via holes may be covered by an insulating layer.

A layer 302 of insulating material, e.g. a silicon oxide layer 302, may be arranged between the second side 314 of the first chip 310 and the second side 324 of the second chip 320.

In various embodiments, at least one of the first chip 310 and the second chip 320 may include at least one electric circuit. In various embodiments, at least one of the first chip 310 and the second chip 320 may include at least one power semiconductor device. Examples of the power semiconductor devices may include but are not limited to power MOSFETs (metal oxide semiconductor field effect transistor), JFETs (junction field effect transistor), IGBTs (insulated gate bipolar transistor), power bipolar transistors, diodes, and the like.

In various embodiments, the first chip 310 may include a diode, e.g. a diode in the diode wafer 210 of FIG. 2. In various embodiments, the second chip 320 may include a power transistor, such as an IGBT (e.g. an IGBT in the IGBT wafer 220 of FIG. 2), or a power MOSFET (e.g. a MOSFET in the FET wafer 230 of FIG. 2).

According to various embodiments, the chip arrangement 300 may be configured as a half bridge circuit, e.g. by electrically coupling the respective contacts of the first chip 310 and the second chip 320 accordingly to form a half bridge circuit.

According to various embodiments, the second chip side 314 of the first chip 310 and the second chip side 324 of the second chip 320 may be bonded to each other. In various embodiments, the second chip side 314 of the first chip 310 and the second chip side 324 of the second chip 320 may be bonded to each other by means of wafer bonding, e.g. by means of anodic bonding.

According to various embodiments, the chip arrangement 300 may further include a re-distribution layer (not shown) disposed over the first chip side 312 of the first chip 310, wherein at least one of the second electrically conductive structure 334 and the at least one contact of the first chip 310 is electrically coupled to the re-distribution layer.

In various embodiments, the first chip 310 may further include at least one contact on its first chip side 312. A third electrically conductive structure (not shown) may be disposed over the first chip side 312 of the first chip 310.

In various embodiments as will be described with reference to FIG. 10 below, the first chip 310 may be a power transistor, wherein its gate electrode and source electrode may be formed on its first chip side 312, and a third electrically conductive structure may be disposed over the first chip side 312 for the gate electrode and source electrode.

According to various embodiments, the second chip 320 may include at least one further contact (not shown) on its second chip side 324. The at least one contact 316 on the second chip side 314 of the first chip 310 and the at least one further contact on the second chip side 324 of the second chip 320 may be arranged relative to each other such that they physically contact each other.

In various embodiments, the chip arrangement 300 may further include a coupling structure (not shown) between the first chip 310 and the second chip 320. The coupling structure may include a first structure side and a second structure side opposite the first structure side, and at least one contact on its first structure side and at least one further contact on its second structure side. The at least one contact on the first structure side may be electrically coupled to the at least one contact on the second chip side of the first chip 310; and the at least one further contact on the second structure side may be electrically coupled to the at least one further contact on the second chip side of the second chip 320.

In various embodiments, the at least one contact on the first structure side and the at least one further contact on the second structure side may be electrically coupled with each other via the coupling structure.

In various embodiments, the coupling structure may include at least one conductor track.

Various embodiments of the chip arrangement 300 described above will be illustrated in more detail below with reference to the figures.

Figure 4:
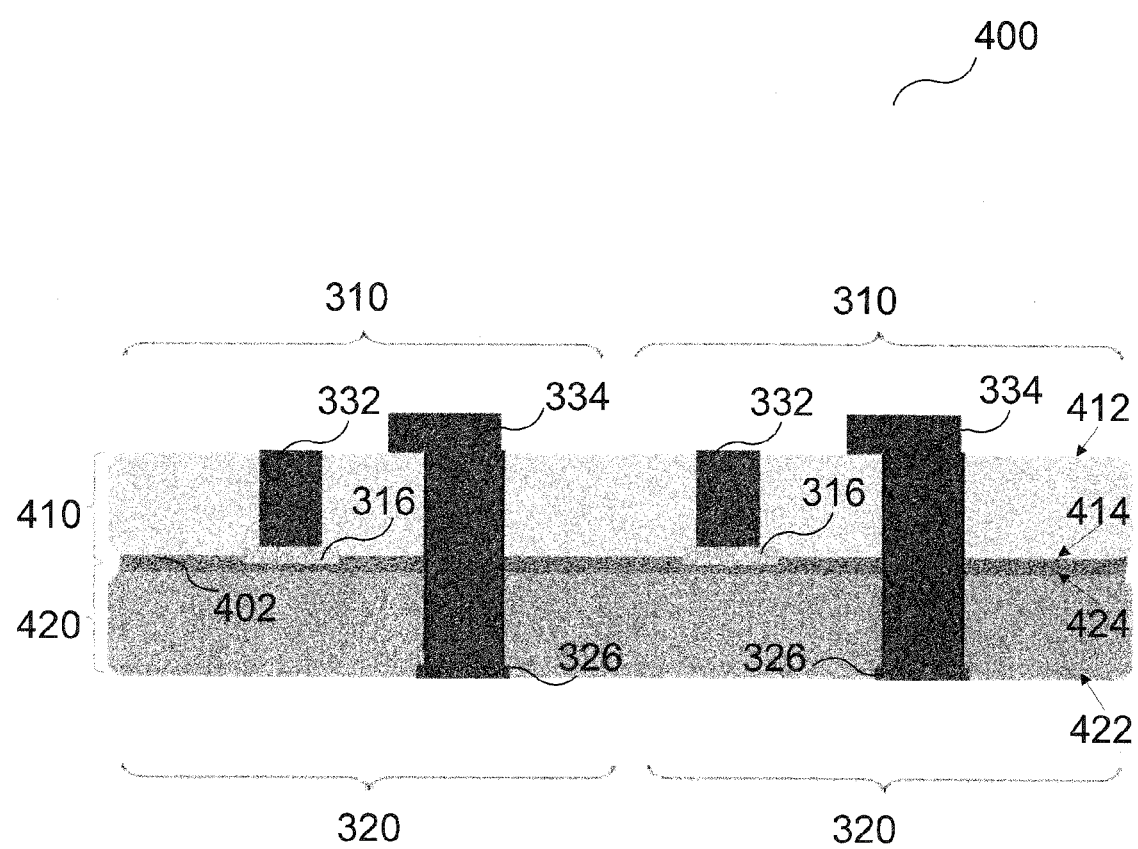
FIG. 4 shows a wafer arrangement according to various embodiments.

FIG. 4 shows a wafer arrangement 400 according to various embodiments.

The wafer arrangement 400 may include a first wafer 410 having a first wafer side 412 and a second wafer side 414 opposite the first wafer side 412, and a plurality of first chips 310. Each first chip 310 may include at least one contact 316 on the second wafer side 414 of the first wafer 410. The first chips 310 may have the similar structure as in FIG. 3.

The wafer arrangement 400 may include a second wafer 420 having a first wafer side 422 and a second wafer side 424 opposite the first wafer side 422, and a plurality of second chips 320. Each second chip 320 may include at least one contact 326 on the first wafer side 422 of the second wafer 420.

The second wafer side 414 of the first wafer 410 and the second wafer side 424 of the second wafer 420 may face each other.

The wafer arrangement 400 may further include a first electrically conductive structure 332 extending from the respective at least one contact 316 of the first chip 310 from the second wafer side 414 of the first wafer 410 through the first chip 310 to the first wafer side 412 of the first wafer 410. The wafer arrangement 400 may further include a second electrically conductive structure 334 extending from the respective at least one contact 326 of the second chip 320 from the first wafer side 422 of the second wafer 420 through the second chip 320 and through the first chip 310 to the first wafer side 412 of the first wafer 410.

The wafer arrangement 400 in FIG. 4 shows two first chips 310 in the first wafer 410 and two second chips 320 in the second wafer 420, but it is understood that various number (e.g., three, four, five, . . . etc.) of first chips and second chips may be included in the first wafer 410 and the second wafer 420. The wafer arrangement 400, after being singularized, may form individual chip arrangements, e.g. a plurality of chip arrangements 300 of FIG. 3.

Various embodiments described with reference to the chip arrangement 300 of FIG. 3 above are analogously valid for the wafer arrangement 400.

In various embodiments, a method of manufacturing a chip arrangement, e.g., the chip arrangement 300 of FIG. 3, may include providing a first chip having a first chip side and a second chip side opposite the first chip side and at least one contact on its second chip side; providing a second chip having a first chip side and a second chip side opposite the first chip side and at least one contact on its first chip side; arranging the first chip and the second chip such that the second chip side of the first chip and the second chip side of the second chip are facing each other; forming a first electrically conductive structure extending from the at least one contact of the first chip from the second chip side of the first chip through the first chip to the first chip side of the first chip; and forming a second electrically conductive structure extending from the at least one contact of the second chip from the first chip side of the second chip through the second chip and through the first chip to the first chip side of the first chip.

In various embodiments, a method of manufacturing a wafer arrangement, e.g., the wafer arrangement 400 of FIG. 4, may include providing a first wafer having a first wafer side and a second wafer side opposite the first wafer side and a plurality of first chips, each first chip including at least one contact on the second wafer side of the first wafer; providing a second wafer having a first wafer side and a second wafer side opposite the first wafer side and a plurality of second chips, each second chip having at least one contact on the first wafer side of the second wafer; arranging the first wafer and the second wafer such that the second wafer side of the first wafer and the second wafer side of the second wafer are facing each other; forming a first electrically conductive structure extending from the respective at least one contact of the first chip from the second wafer side of the first wafer through the first chip to the first wafer side of the first wafer; and forming a second electrically conductive structure extending from the respective at least one contact of the second chip from the first wafer side of the second chip through the second chip and through the first chip to the first wafer side of the first wafer.

FIGS. 5A to 5I below illustrates various process stages for manufacturing a wafer arrangement or a chip arrangement according to various embodiments.

Figure 5A:
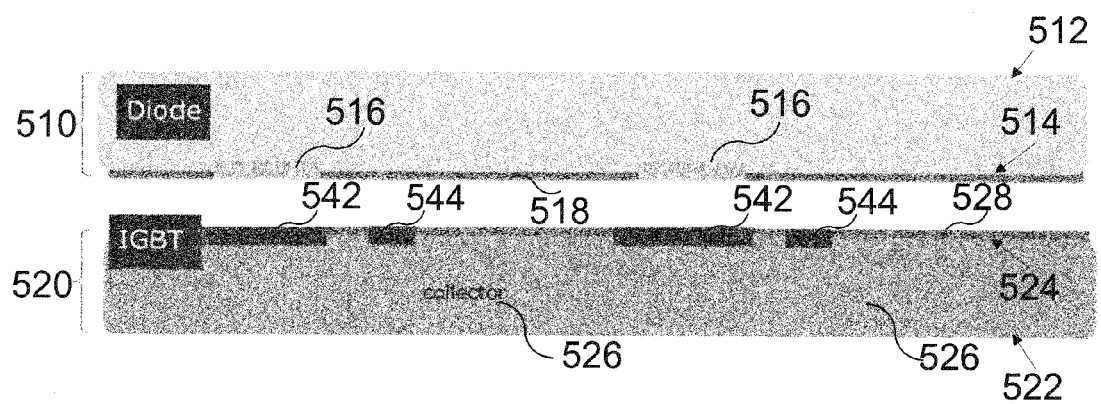
FIGS. 5A to 5I illustrate various process stages for manufacturing a wafer arrangement or a chip arrangement according to various embodiments.

FIG. 5A shows a diagram 501, wherein a first wafer 510 and a second wafer 520 are provided.

The first wafer 510 may have a first wafer side 512 and a second wafer side 514 opposite the first wafer side 512, and a plurality of first chips. Each first chip may include at least one contact 516 on the second wafer side 514 of the first wafer 510.

The second wafer 520 may have a first wafer side 522 and a second wafer side 524 opposite the first wafer side 522, and a plurality of second chips. Each second chip may include at least one contact 526 on the first wafer side 522 of the second wafer 520.

In various embodiments, at least one of the first chips and the second chips may include at least one electric circuit. At least one of the first chips and the second chips may include at least one power semiconductor device. Examples of the power semiconductor devices may include but are not limited to power MOSFETs (metal oxide semiconductor field effect transistor), JFETs (junction field effect transistor), IGBTs (insulated gate bipolar transistor), power bipolar transistors, diodes, and the like.

In various embodiments, at least one of the first chips may include a diode, e.g. a diode in the diode wafer 210 of FIG. 2. In various embodiments, at least one of the second chips may include a power transistor, such as an IGBT (e.g. an IGBT in the IGBT wafer 220 of FIG. 2), or a power MOSFET (e.g. a MOSFET in the FET wafer 230 of FIG. 2).

Each of the first wafer 510 and the second wafer 520 may be covered with a layer of insulating material. For example, a silicon oxide layer 518 may be provided at the second wafer side 514 of the first wafer 510, and a silicon oxide layer 528 may be provided at the second wafer side 524 of the second wafer 520, similar to the wafer structure 210, 220, 230 of FIG. 2.

For illustrative purposes, in various embodiments of FIGS. 5A to 5I, the first chips may be diode chips and the first wafer 510 may have the structure of the diode wafer 210 as shown in FIG. 2; the second chips may be IGBT chips and the second wafer 520 may have the structure of the IGBT wafer 220 as shown in FIG. 2. It is understood that each of the first wafer 510 and the second wafer 520 may be one of the diode wafer 210, IGBT wafer 220, or FET wafer 230 of FIG. 2, or other types of wafer including other types of chips or electric circuit.

According to various embodiments, at least one second chip of the second chip 520 may include at least one further contact 542, 544 on the second wafer side 524 of the second wafer 520. In an example wherein the second chips are IGBT chips, the further contacts may include emitter contact 542 and gate contacts 544.

Figure 5B:
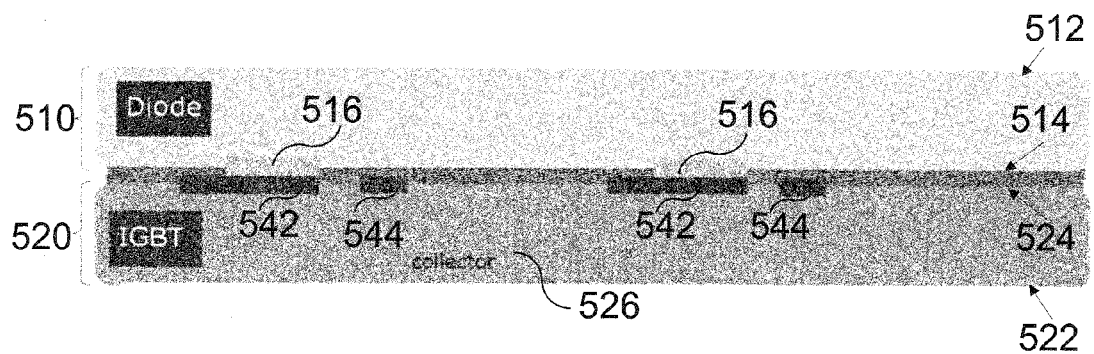

FIG. 5B shows a diagram 502, in which the first wafer 510 and the second wafer 520 are arranged such that the second wafer side 514 of the first wafer 510 and the second wafer side 524 of the second wafer 520 face each other.

In various embodiments, the second wafer side 514 of the first wafer 510 and the second wafer side 524 of the second wafer 520 may be bonded to each other. In various embodiments, the second wafer side 514 of the first wafer 510 and the second wafer side 524 of the second wafer 520 may be bonded to each other by means of wafer bonding, e.g. by means of anodic bonding. In this manner, an active silicon wafer (e.g. the IGBT wafer 520) may be anodic coupled with a doped silicon wafer (e.g. the diode wafer 510), using the doped silicon wafer 510 as a carrier (e.g. an inactive carrier wafer) and encapsulation medium. Accordingly, the active wafer 520 is encapsulated and coupled with the inactive carrier wafer 510. In various embodiments, metallic coupling between the first wafer 510 and the second wafer 520 may be provided, e.g. by means of diffusion soldering.

According to various embodiments, the at least one contact 516 on the second wafer side 514 of the first wafer 510 and the at least one further contact on the second wafer side 524 of the second wafer 520, e.g. the emitter contacts 542 of the second IGBT chips, may be arranged relative to each other such that they physically contact each other. In various embodiments, the at least one contact 516 of the first wafer 510 may be electrically coupled with the at least one further contact 542 of the second wafer 520 by diffusion soldering of contact pads.

Figure 5C:
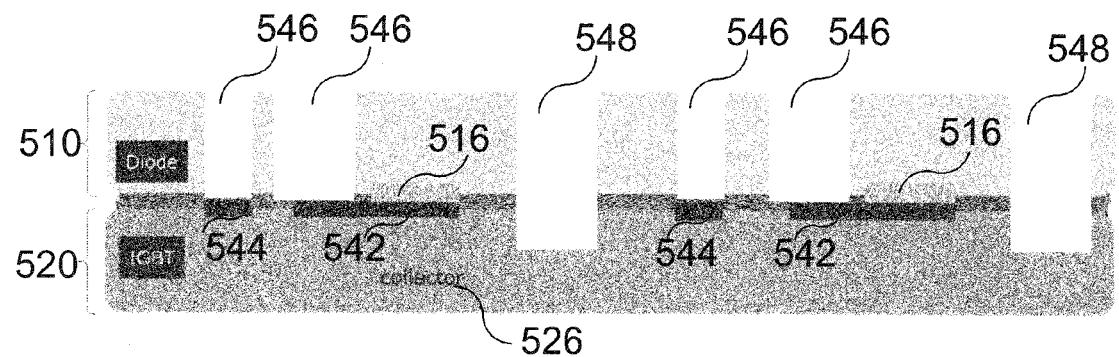

FIG. 5C shows a diagram 503, in which contact holes may be formed.

In various embodiments, contact holes 546, 548 may be etched into the first wafer 510 using an etch process, such as an anisotropic etch process, e.g. Bosch process. An etch stop structure (not shown) may be provided on the first wafer 510, e.g. on the first wafer side 512 of the first wafer 510, e.g., by means of ion implantation.

The contact holes 546, 548 may be formed as through holes or via holes through the first wafer 510. In various embodiments, the contact holes 546 may be formed through the first wafer such that they are located on and contacting one or more of the contacts of the first wafer 510 and the second wafer 520, e.g. the at least one contact 516 on the second wafer side 514 of the first wafer 510, and/or the at least one further contact 542, 544 on the second wafer side 524 of the second wafer 520. In an illustrative embodiment, the contact holes 546 are formed on and contacting with the emitter contacts 542 and the gate contacts 544 of the second wafer 520.

In various embodiments, contact holes 546, 548 having different depth may be formed. For example, a first group of contact holes 546 may be formed as through holes or via holes through the first wafer 510, and a second group of contact holes 548 may be formed through the first wafer 510 and at least part of the second wafer 520. For example, the second group of contact holes 548 may be formed such that they extends into the second wafer 520 to contact with the at least one contact 526 (e.g. the collector contact 526) at the first wafer side of the second wafer 520. In various embodiments, the second group of contact holes 548 may be formed by forming a plurality of contact holes having a first depth, and providing an etch stop structure (e.g., by means of ion implantation) on the surface of the contact holes corresponding to the first group of contact holes 546, and etching the remaining contact holes to a second depth to form the second group of contact holes 548.

In various embodiments, at least one of the first wafer 510 and the second wafer 520 may have a thickness in the range from about 500 μm to about 1000 μm, e.g. in the range from about 600 μm to about 800 μm, e.g. in the range from about 700 μm to about 750 μm.

Figure 5D:
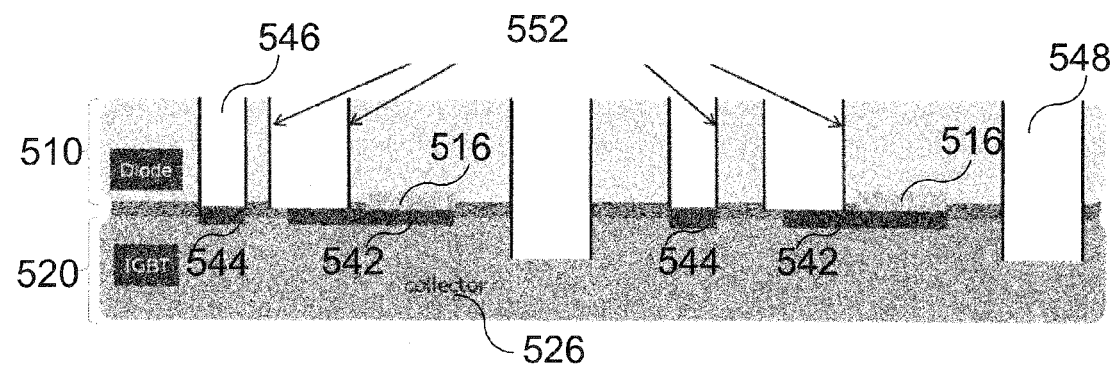

FIG. 5D shows a diagram 504, in which a sidewall insulation 552 is formed.

A layer of insulating material 552, e.g. a layer of silicon oxide ($SiO_2$), may be deposited at the sidewalls of the contact holes 546, 548 for electrical isolation of the sidewalls. In various embodiments, the sidewall insulation 552 may be formed by means of a chemical vapor deposition (CVD), or by thermal oxidation of the silicon (e.g. the silicon wafer 510), or by chemical isolation.

Figure 5E:
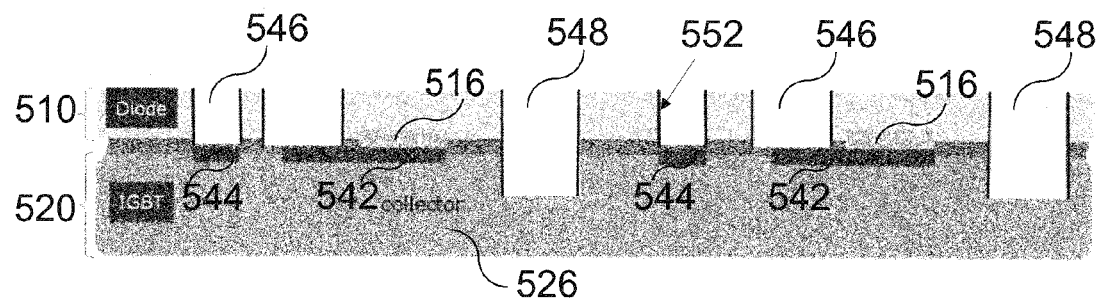

FIG. 5E shows a diagram 505, in which the first wafer 510 is thinned.

The thinning of the first wafer 510 may be carried out from the first wafer side 512 down to a desired thickness of the first wafer 510, e.g. to a thickness of equal to or smaller than 100 μm. In various embodiments, the first wafer 510 may be thinned to the desired thickness, e.g. a thickness in the range from about 20 μm to about 80 μm, e.g. a thickness in the range from about 30 μm to about 60 μm, e.g. to a thickness in the range from about 40 μm to about 50 μm, etc.

In various embodiments, the first wafer 510 may be thinned before the contact holes 546, 548 are etched in FIG. 5C and/or before the sidewall isolation 552 are formed in FIG. 5D.

In various embodiments, the second wafer 520 may be thinned instead of the first wafer 510, e.g. before the contact hole etch of FIG. 5C and/or before the side wall isolation of FIG. 5D, or after the side wall isolation of FIG. 5D.

Figure 5F:
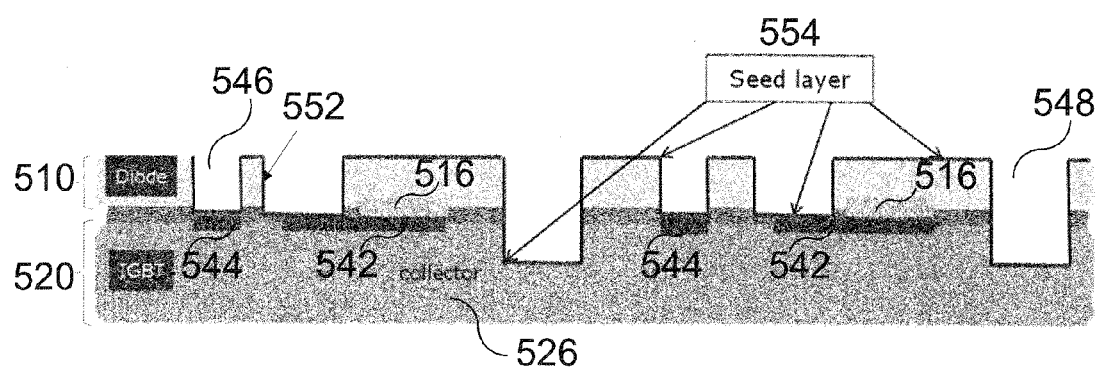

FIG. 5F shows a diagram 506, in which metallic seeding of the first wafer and the sidewalls of contact holes 546, 548 is carried out.

A seed layer 554, e.g. a metallic seed layer, may be deposited and activated on the first wafer 510, e.g. on the top surface of the first wafer 510 and the bottom surface of the contact holes 546, 548. In an embodiment, the seed layer 554 may or may not be deposited on the sidewalls of the contact holes 546, 548.

Figure 5G:
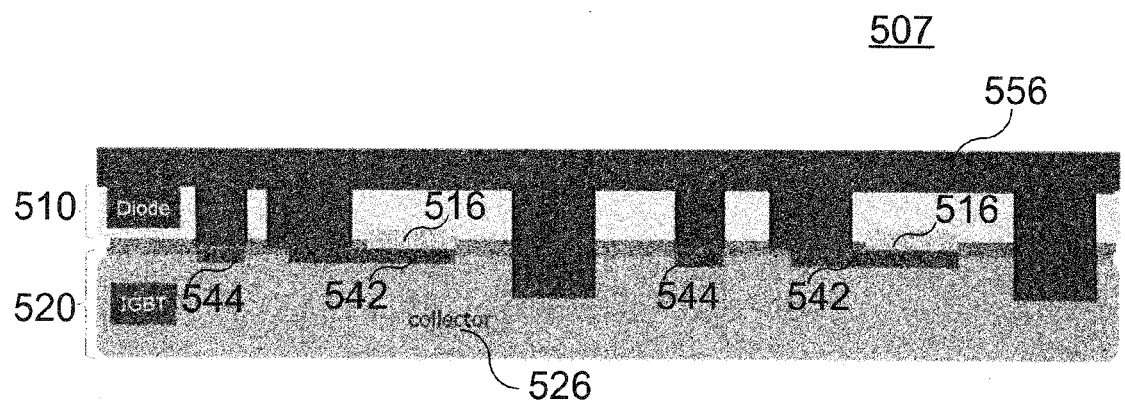

FIG. 5G shows a diagram 507, in which an electrically conductive structure 556, e.g. a metallization layer, may be formed over the first wafer 510. may be deposited on the top surface of the first wafer 510 and in the contact holes 546, 548.

In various embodiments, electrically conductive material 556, e.g., metal or metal alloy, may be deposited onto the top surface of the first wafer 510 and in the contact holes 546, 548, e.g. through galvanic deposition, to form metallic contacts therein for electrical coupling of the chips within the first wafer 510 and the second wafer 520.

Figure 5H:
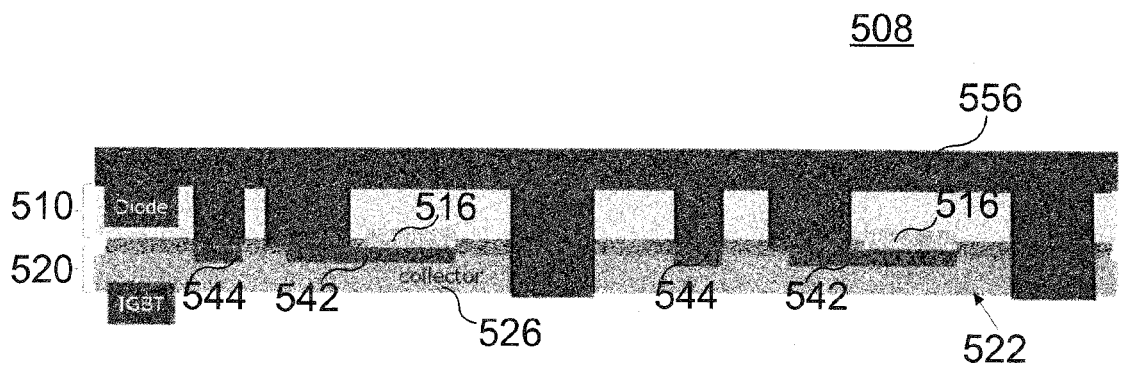

FIG. 5H shows a diagram 508, in which thinning of the second wafer 520 is carried out.

The thinning of the second wafer 520 may be carried out from the first wafer side 522, i.e. the back side of the second wafer 520. The back side thinning of the second wafer 520 may be carried out down to a desired thickness of the second wafer 520. e.g. to a thickness of equal to or smaller than 100 μm. In various embodiments, the second wafer 520 may be thinned to the desired thickness, e.g. a thickness in the range from about 20 μm to about 80 μm, e.g. a thickness in the range from about 30 μm to about 60 μm, e.g. to a thickness in the range from about 40 μm to about 50 μm, etc.

Figure 5I:
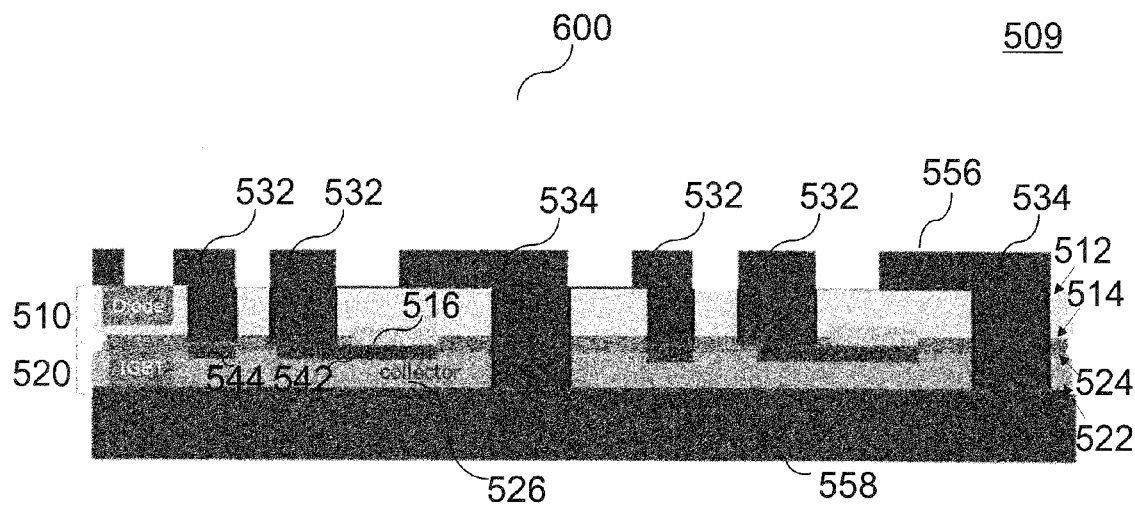

FIG. 5I shows a diagram 509, in which the metallization layer 556 on the top side surface of the first wafer 510 may be patterned and a metallization layer 558 may be deposited on the back side surface of the second wafer 520.

In various embodiments, the metallization layer 556 on the top side surface of the first wafer 510 may be patterned, e.g. lithographically through a photolithography process, so as to form a first electrically conductive structure 532 and a second electrically conductive structure 534.

The first electrically conductive structure 532, formed by the first group of contact holes 546 and the conductive material deposited therein, may extend from the respective at least one contact 516 from the second wafer side 514 of the first wafer 510 through the first chip to the first wafer side 512 of the first wafer 510. In an embodiment, the first electrically conductive structure 532 may extend from the at least one further contact 544, 542 (e.g. the gate contact 542 and the source contact 544 of the IGBT chips) on the second wafer side 524 of the second wafer 520 through the first chip to the first wafer side 512 of the first wafer 510. In an embodiment, the source contact 544 of the IGBT chips physically contact the at least one contact 516 of the diode chips on the second wafer side 514 of the first wafer 510, and accordingly the first electrically conductive structure 532 may be electrically coupled to the contact 516 of the first wafer 510 through the further contact 542 of the second wafer 520.

The second electrically conductive structure 534, formed by the second group of contact holes 548 and the conductive material deposited therein, may extend from the respective at least one contact 526 of the second chip from the first wafer side 522 of the second wafer 520 through the second chip and through the first chip to the first wafer side 512 of the first wafer 510.

A wafer arrangement 600 according to various embodiment described above is formed as shown in FIG. 5I.

Figure 6:
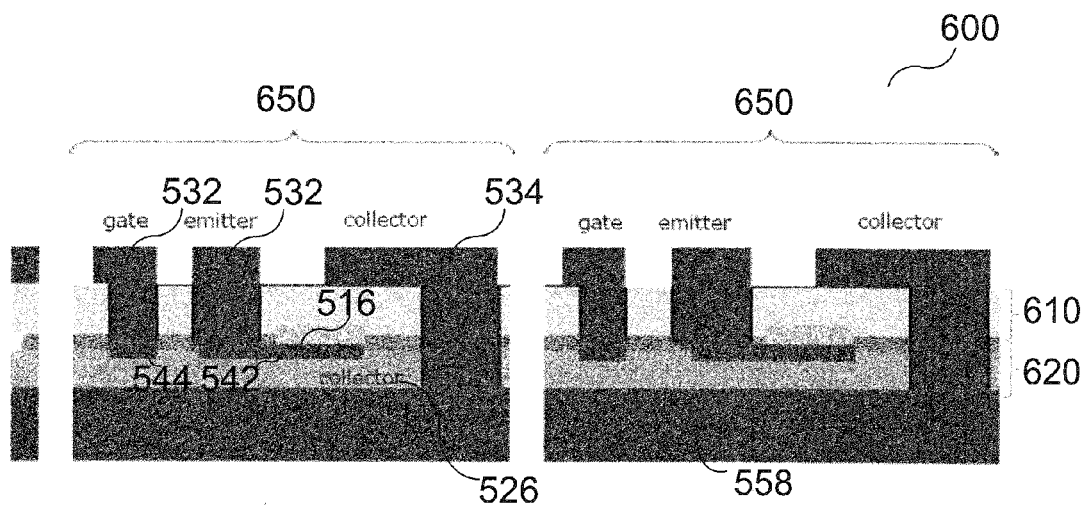
FIG. 6 shows a wafer arrangement and a chip arrangement according to various embodiments.

FIG. 6 shows a wafer arrangement 600 and a chip arrangement 650 according to various embodiments.

As shown in FIG. 6, the wafer arrangement 600 of FIG. 5I is further singularized through a singulation process to form individual chip arrangements 650.

Each chip arrangement 650 may include a first chip 610 having a first chip side and a second chip side opposite the first chip side and at least one contact 516 on its second chip side; and a second chip 620 having a first chip side and a second chip side opposite the first chip side and at least one contact 526 on its first chip side; wherein the second chip side of the first chip 610 and the second chip side of the second chip 620 are facing each other. Each chip arrangement 650 may further include a first electrically conductive structure 532 extending from the at least one contact of the first chip 610 from the second chip side of the first chip 610 through the first chip 610 to the first chip side of the first chip 610; and a second electrically conductive structure 534 extending from the at least one contact 526 of the second chip 620 from the first chip side of the second chip 620 through the second chip 620 and through the first chip 610 to the first chip side of the first chip 610.

Figure 1:
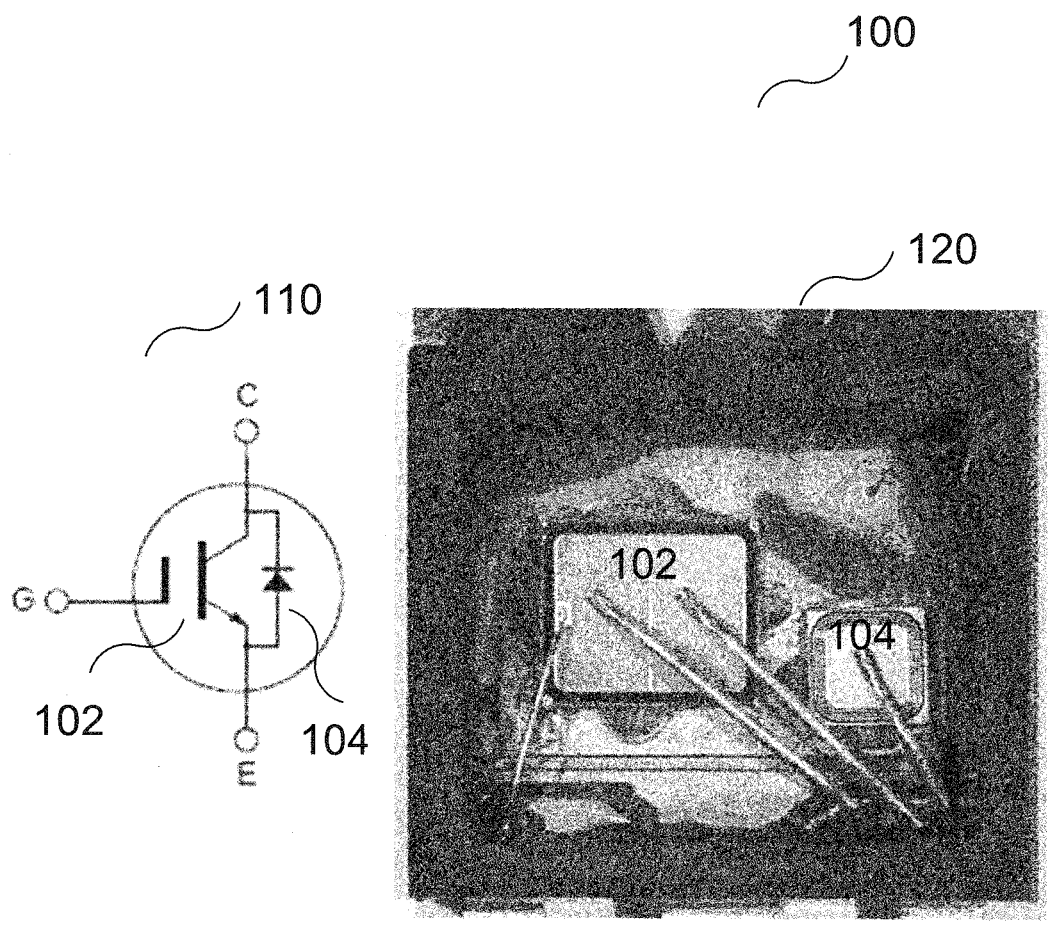
FIG. 1 shows a diagram including a circuit and a package.

In an illustrative embodiment, the chip arrangement 650 may form a circuit 110 as shown in FIG. 1, including a diode chip and an IGBT chip. The first electrically conductive structure 532 and the second electrically conductive structure 534 are connected with the gate contact 544, the emitter contact 542 and the collector contact 526 of the IGBT chip, respectively. The contact 516 may be the anode contact of the diode chip, which is electrically coupled with the emitter contact 542 of the IGBT chip; and the cathode contact (e.g. in the substrate of the first chip 610) of the diode chip is electrically coupled with the collector contact 526 of the IGBT chip through the second electrically conductive structure 534. In accordance with various embodiments, a diode circuit device may be combined with an IGBT circuit device by means of "encapsulation" using the wafer material (e.g. silicon).

According to various embodiments, the wafer arrangement 600 may further include a re-distribution layer (not shown) disposed over the first wafer side of the first wafer, wherein at least one of the second electrically conductive structure 534 and the at least one contact 516 of the first chip 610 is electrically coupled to the re-distribution layer. After singulation, the chip arrangement 600 may also include a re-distribution layer (not shown) disposed over the first chip side of the first chip 610, wherein at least one of the second electrically conductive structure 534 and the at least one contact 516 of the first chip 610 is electrically coupled to the re-distribution layer In various embodiments, the chip arrangement 650 may be further connected to a printed circuit board or a leadframe after the singulation process, or after deposition of a solderable surface (i.e. plating or finish) over the chip arrangement 650. The leadframe may be a pre-structured leadframe or a post-structured leadframe. In various embodiments, a plurality of chip arrangements 650, i.e. a plurality of singularized chips, may be attached on one or more leadframes.

In various embodiments, an isolating structure, e.g. an isolating foil or isolating adhesive (e.g. polymer matrix material), may be dispended on the chips, for example, on the chips of the chip arrangement 650.

In various embodiments, an isolating structure may be disposed between the chip arrangement and the leadframe. For example, a plurality of through holes may be provided in the isolating structure which adheres the chip arrangement to the leadframe, to provide electrical coupling between the contact of the chip arrangement and the leadframe.

The chip arrangement 650 can be cooled from both sides. In various embodiments, one side of the chip arrangement 650, e.g. the front side, may be cooled via a printed circuit board, which may optionally be provided with thermal vias, for example. The backside of the chip arrangement 650, e.g. the backside of the IGBT chip 620 may be coupled to a cooling structure or cooling body, e.g. a heatsink plate.

Figure 7A:
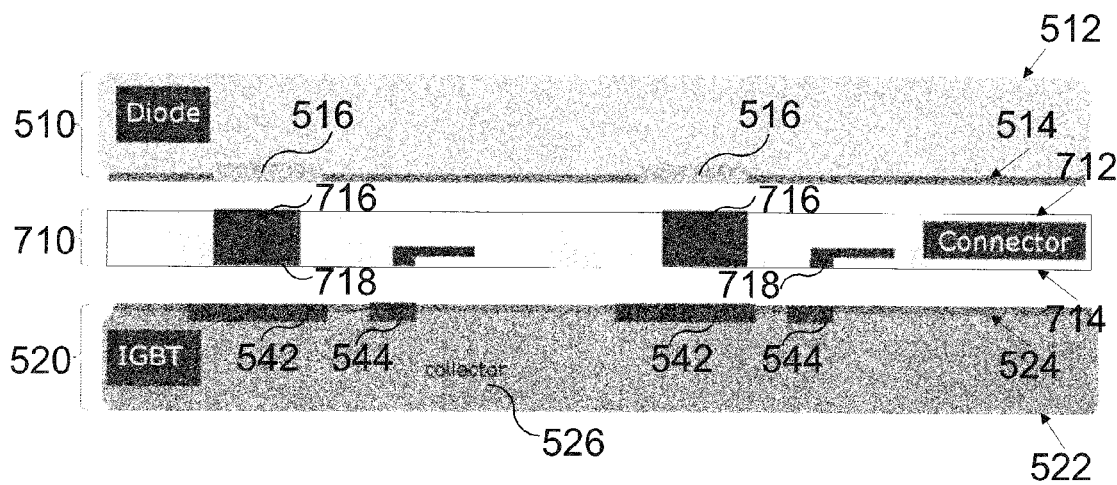
FIGS. 7A to 7C illustrate various process stages for manufacturing a wafer arrangement or a chip arrangement according to various embodiments.
Figure 7B:
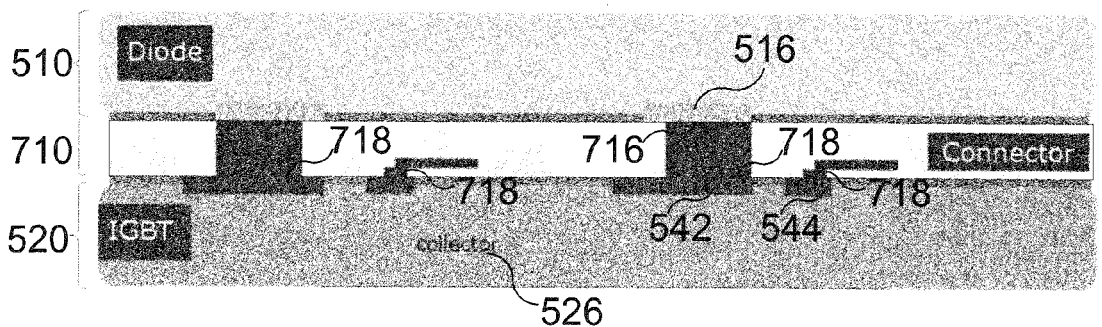
Figure 7C:
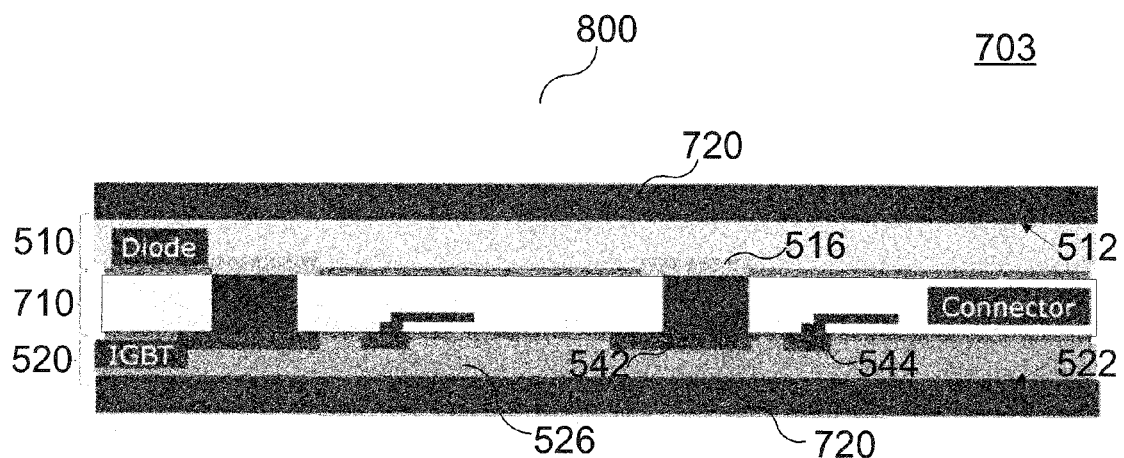

FIGS. 7A to 7C below illustrates various process stages for manufacturing a wafer arrangement or a chip arrangement according to various embodiments.

FIG. 7A shows a diagram 701, wherein a first wafer 510 and a second wafer 520, e.g. the first wafer 510 and the second wafer 520 shown in FIG. 5A, are provided.

Similar to the embodiments of FIG. 5A, the first wafer 510 may have a first wafer side 512 and a second wafer side 514 opposite the first wafer side 512, and a plurality of first chips. Each first chip may include at least one contact 516 on the second wafer side 514 of the first wafer 510. The second wafer 520 may have a first wafer side 522 and a second wafer side 524 opposite the first wafer side 522, and a plurality of second chips. Each second chip may include at least one contact 526 on the first wafer side 522 of the second wafer 520.

In various embodiments, at least one of the first chips and the second chips may include at least one electric circuit. At least one of the first chips and the second chips may include at least one power semiconductor device, such as a power MOSFET, a JFET, an IGBT, a power bipolar transistor, a diode, and the like.

For illustrative purposes, as shown in FIGS. 7A to 7C, the first chips may be diode chips and the first wafer 510 may have the structure of the diode wafer 210 as shown in FIG. 2; the second chips may be IGBT chips and the second wafer 520 may have the structure of the IGBT wafer 220 as shown in FIG. 2. It is understood that each of the first wafer 510 and the second wafer 520 may be one of the diode wafer 210, IGBT wafer 220, or FET wafer 230 of FIG. 2, or other types of wafer including other types of chips or electric circuit.

According to various embodiments, at least one second chip of the second chip 520 may include at least one further contact 542, 544 on the second wafer side 524 of the second wafer 520. In an example wherein the second chips are IGBT chips, the further contacts may include emitter contact 542 and gate contacts 544.

Different from FIG. 5A, a coupling structure 710 (also referred to as a connector) is provided. The coupling structure may be arranged between the first wafer 510 and the second wafer 520.

The coupling structure 710 may include a first structure side 712 and a second structure side 714 opposite the first structure side 712, and at least one contact 716 on its first structure side 714 and at least one further contact 718 on its second structure side 714.

In various embodiments, the at least one contact 716 on the first structure side 712 and the at least one further contact 718 on the second structure side 714 may be electrically coupled with each other via the coupling structure 710, e.g. via through holes filled with electrically conductive material connecting the at least one contact 716 and the at least one further contact 718.

In various embodiments, the coupling structure 710 may be an insulating layer embedded with at least one conductor track.

FIG. 7B shows a diagram 702, in which the first wafer 510 and the second wafer 520 are joined through the coupling structure 710.

In various embodiments, the first wafer 510 and the second wafer 520 may be bonded to each other through the coupling structure 710, for example, by bonding the coupling structure 710 using at least one of anodic bonding, diffusion soldering, solder connection, active metal brazing, or the like. In various embodiments, metallic coupling between the first wafer 510 and the coupling structure 710 and between the second wafer 520 and the coupling structure 710 may be provided, e.g. by means of diffusion soldering.

In various embodiments, the first wafer 510 and the second wafer 520 may be arranged such that the second wafer side 514 of the first wafer 510 and the second wafer side 524 of the second wafer 520 face each other, with the coupling structure 710 arranged inbetween. In various embodiments, the at least one contact 716 on the first structure side 712 of the coupling structure 710 may be electrically coupled to the at least one contact 516 on the second wafer side 514 of the first wafer 510; and the at least one further contact 718 on the second structure side 714 of the coupling structure 710 may be electrically coupled to the at least one further contact 542, 544 on the second wafer side 524 of the second wafer 520.

In an illustrative embodiment, the contact 516 of the first wafer 510 may be electrically coupled to the further contact 542 (e.g. the emitter contact) of the second wafer 520 through the coupling structure 710.

FIG. 7C shows a diagram 703, in which a thinning process and a metallization process may be carried out.

In various embodiments, at least one of the first wafer 510 and the second wafer 520 may be thinned to a desired thickness, e.g. to a thickness of equal to or smaller than 100 μm, e.g. a thickness in the range from about 20 μm to about 80 μm, e.g. a thickness in the range from about 30 μm to about 60 μm, e.g. to a thickness in the range from about 40 μm to about 50 μm, etc. The thinning of the first wafer 510 may be carried out from the first wafer side 512 of the first wafer 510, and the thinning of the second wafer 520 may be carried out from the first wafer side 522 of the second wafer 520.

In various embodiments, a respective electrically conductive layer 720, e.g. a metal layer, may be formed over the first wafer side 512 of the first wafer 510 and the first wafer side 522 of the second wafer 520. The electrically conductive layer 720 may be used for electrical coupling, and/or for cooling purposes.

The structure of a wafer arrangement 800 formed according to various embodiment is shown in FIG. 7C.

Figure 8:
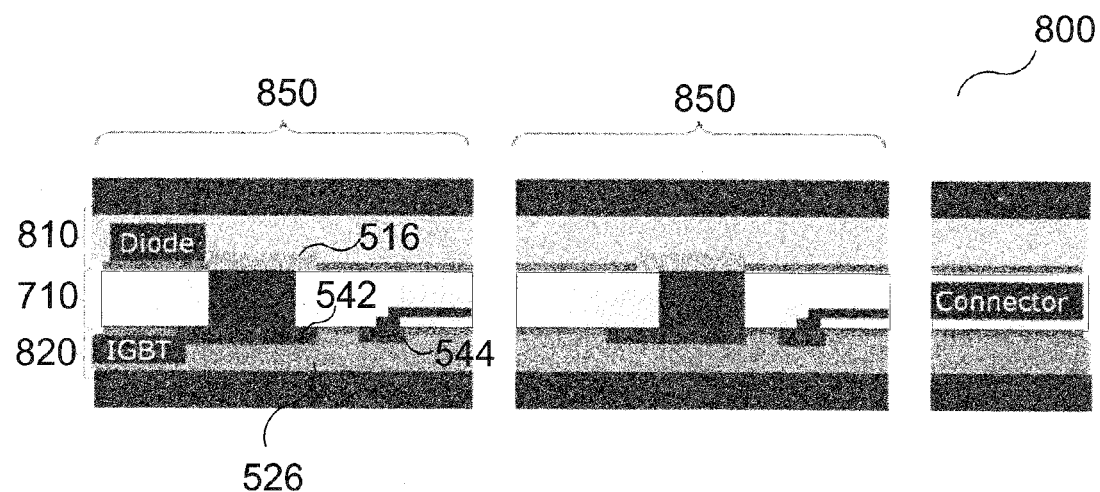
FIG. 8 shows a wafer arrangement and a chip arrangement according to various embodiments.

FIG. 8 shows a wafer arrangement 800 and a chip arrangement 850 according to various embodiments.

As shown in FIG. 8, the wafer arrangement 800 of FIG. 7C is further singularized through a singulation process to form individual chip arrangements 850.

Each chip arrangement 850 may include a first chip 810 having a first chip side and a second chip side opposite the first chip side and at least one contact 516 on its second chip side; and a second chip 820 having a first chip side and a second chip side opposite the first chip side and at least one contact 526 on its first chip side.

A coupling structure 710 (also referred to as a connector) described in various embodiments above may be arranged between the first chip 810 and the second wafer 820, wherein the second chip side of the first chip 810 and the second chip side of the second chip 820 are facing each other. The contact 516 of the first chip 810 may be electrically coupled with the contact 542 of the second chip 820 through the coupling structure 710.

In an illustrative embodiment, the chip arrangement 850 may form a circuit 110 as shown in FIG. 1, including a diode chip 810 and an IGBT chip 820. The contact 516 may be the anode contact of the diode chip 810, which is electrically coupled with the emitter contact 542 of the IGBT chip 820 through the coupling structure 710. The terminal to the coupling structure 710, e.g. to the gate contact 544 of the IGBT chip 820, may be provided laterally at the lateral side of the coupling structure 710.

In accordance with various embodiments, a diode circuit device may be combined with an IGBT circuit device by means of "encapsulation" using the wafer material (e.g. silicon).

In the chip arrangement 850 and the wafer arrangement 800, the edge structures of the chips, e.g. the power semiconductor chips, may be shielded from the environment by the semiconductor material of the wafers 810, 820 and by the isolating coupling structure 710. In various embodiments, the conductor tracks in the coupling structure 710 may also be configured as shields, and thus the in-diffusion of impurities may be efficiently prevented. These impurities, which are in particular contained in the package materials or which may advance to the semiconductor top side due to delaminations, often result in a drift of edge structures, which makes it necessary to configure the chip arrangement in a more elaborate manner and in a wider and thus more expensive structure. The structure of the chip arrangement 850 of various embodiments, without package materials, may allow simpler and more insensitive semiconductor devices. The metallization of the front side and the back side of the wafer arrangement 800 having large areas may also simplify the Double Side Cooling.

In various embodiments, the chip arrangement 850 may be further connected to a printed circuit board or a leadframe. The leadframe may be a pre-structured leadframe or a post-structured leadframe. In various embodiments, a plurality of chip arrangements 850, i.e. a plurality of singularized chips, may be attached on one or more leadframes.

An isolating structure, e.g. an isolating foil or isolating adhesive (e.g. polymer matrix material), may be dispended on the chips, for example, on the chips of the chip arrangement 850.

In various embodiments, an isolating structure may be disposed between the chip arrangement and the leadframe. For example, a plurality of through holes may be provided in the isolating structure which adheres the chip arrangement to the leadframe, to provide electrical coupling between the contact of the chip arrangement and the leadframe.

The embodiments described with reference to FIGS. 5A-5I, FIG. 6, FIGS. 7A-7C and FIG. 8 above combines a diode wafer/chip with an IGBT wafer/chip. In the following, various embodiments are described in which two wafers having power transistor chips are combined.

Figure 9:
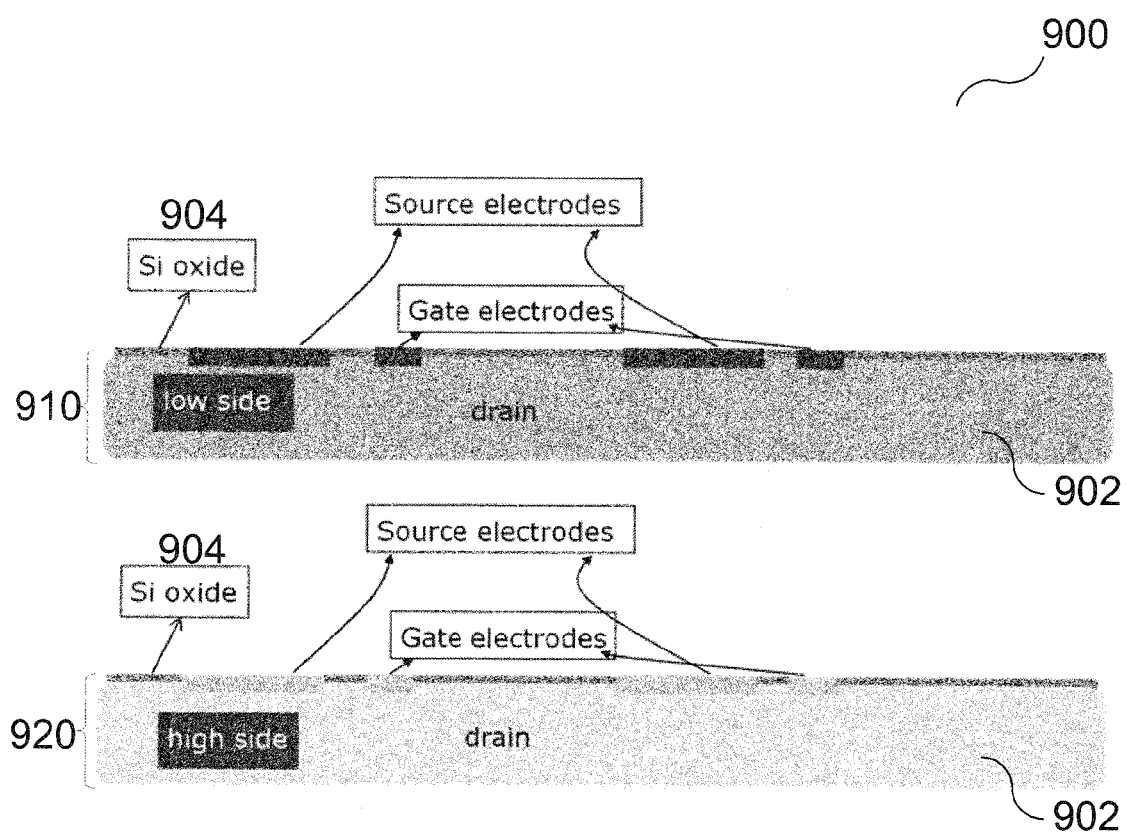
FIG. 9 shows a wafer structure according to various embodiments.

FIG. 9 shows a wafer structure 900 according to various embodiments.

A first wafer 910 and a second wafer 920 are shown, wherein each wafer may include power semiconductor chips. Each wafer 910, 920 may include transistor chips, e.g. power MOSFET chips.

The first wafer 910 may be used as low side transistors in a half bridge circuit, and is also referred to as a low side wafer.

The second wafer 920 may be used as high side transistors in the half bridge circuit, and is also referred to as a high side wafer.

In various embodiments, each of the first and the second wafers 910, 920 may have a plurality of MOSFETs therein, wherein two MOSFETs are shown in each wafer in FIG. 9. The MOSFETs may be formed in a semiconductor substrate 902, e.g. a silicon substrate, on which electrical contacts of the MOSFETs, e.g. gate electrodes and source electrodes, may be formed. Electrical contacts of the MOSFETS, e.g. drain electrodes, may also be formed within the semiconductor substrate 902, e.g. by doping. The semiconductor substrate 902 may be covered with a layer of insulating material 904, e.g. a silicon oxide layer 904, to insulate the gate electrodes and source electrodes from each other. The MOSFET wafer 910, 920 may be singularized into a plurality of FET chips.

In various embodiments, the first MOSFET wafer 910 and the second MOSFET wafer 920 may be used to form a wafer arrangement according to various processes described in FIGS. 5A-5I, or according to various processes described in FIGS. 7A-7C above. The thus formed wafer arrangement may be singularized to form individual chip arrangement, e.g. according to the singulation of FIG. 6 or FIG. 8.

Figure 10:
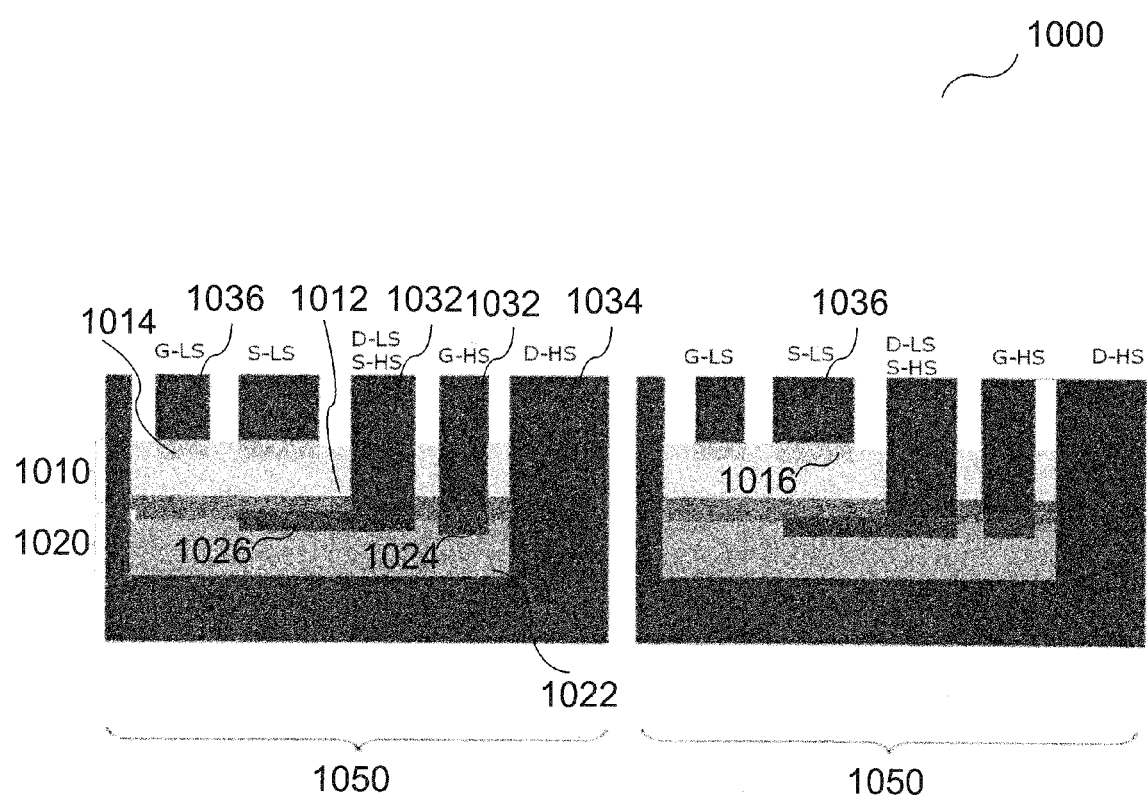
FIG. 10 shows a wafer arrangement according to various embodiments.

FIG. 10 shows a wafer arrangement 1000 formed using the MOSFET wafer 910, 920 of FIG. 9 according to various embodiments above.

The wafer arrangement 1000 is singularized to form a plurality of chip arrangement 1050, wherein two chip arrangements 1050 are shown in FIG. 10.

The chip arrangement 1050 may include a first chip 1010 and a second chip 1020. The first chip 1010 may have a first chip side (e.g. the top side in FIG. 10) and a second chip side (e.g. the bottom side in FIG. 10) opposite the first chip side, and at least one contact 1012 on its second chip side. The second chip 1020 may have a first chip side (e.g. the bottom side in FIG. 10) and a second chip side (e.g. the top side in FIG. 10) opposite the first chip side, and at least one contact 1022 on its first chip side. The second chip side of the first chip 1010 and the second chip side of the second chip 1020 may face each other.

In an embodiment, the first chip 1010 is a low side MOSFET chip, and the second chip 1020 is a high side MOSFET chip.

The chip arrangement 1050 may include a first electrically conductive structure 1032 extending from the at least one contact 1012 of the first chip 1010 from the second chip side of the first chip 1010 through the first chip 1010 to the first chip side of the first chip 1010. The chip arrangement 1050 may further include a second electrically conductive structure 1034 extending from the at least one contact 1022 of the second chip 1020 from the first chip side of the second chip 1020 through the second chip 1020 and through the first chip 1010 to the first chip side of the first chip 1010.

In various embodiments, the first electrically conductive structure 1032 may extend through via holes through the first chip 1010, wherein the sidewalls of the via holes may be covered by an insulating layer. In various embodiments, the second electrically conductive structure 1034 may extend through via holes through the first chip 1010 and the second chip 1020, wherein the sidewalls of the via holes may be covered by an insulating layer.

In various embodiments, the first chip 1010 may further include at least one contact on its top chip side. The at least one contact on its top chip side may include a gate contact 1014 and a source contact 1016.

In various embodiment, a third electrically conductive structure 1036 may be disposed over the top chip side of the first chip 1010. The third electrically conductive structure 1036 may be coupled to the gate contact 10104 and the source contact 1016 to form a low side gate terminal G-LS and a low side source terminal S-LS of the chip arrangement 1050.

According to various embodiments, the second chip 1020 may include at least one further contact, e.g. a gate contact 1024 and a source contact 1026, on its second chip side, i.e. the top chip side in FIG. 10. The drain contact 1012 on the bottom chip side of the first chip 1010 and the at least one further contact, e.g. the source contact 1026, on the second chip side 324 of the second chip 1020 may be arranged relative to each other such that they physically contact each other.

In various embodiments, the first electrically conductive structure 1032 may be coupled with the drain contact 1012 of the low side chip 1010 and the source contact 1026 of the high side chip 1020, to form a terminal for low side drain D-LS and high side source S-HS of the chip arrangement 1050. In various embodiments, the first electrically conductive structure 1032 may be coupled with the gate contact 1024 of the high side chip 1020, to form a high side gate terminal G-HS of the chip arrangement 1050.

In various embodiments, the second electrically conductive structure 1034 may be coupled with the drain contact 1022 of the high side chip 1020, to form a high side drain terminal D-HS of the chip arrangement 1050.

According to various embodiments, the chip arrangement 1050 may be configured as a half bridge circuit, e.g. by electrically coupling the respective contacts of the low side chip 1010 and the high side chip 1020 accordingly to form a half bridge circuit.

A top view of the chip arrangement 1050 showing the respective terminals G-LS, S-LS, D-LS and S-HS, G-HS, D-HS described above is illustrated in FIG. 11.

Figure 11:
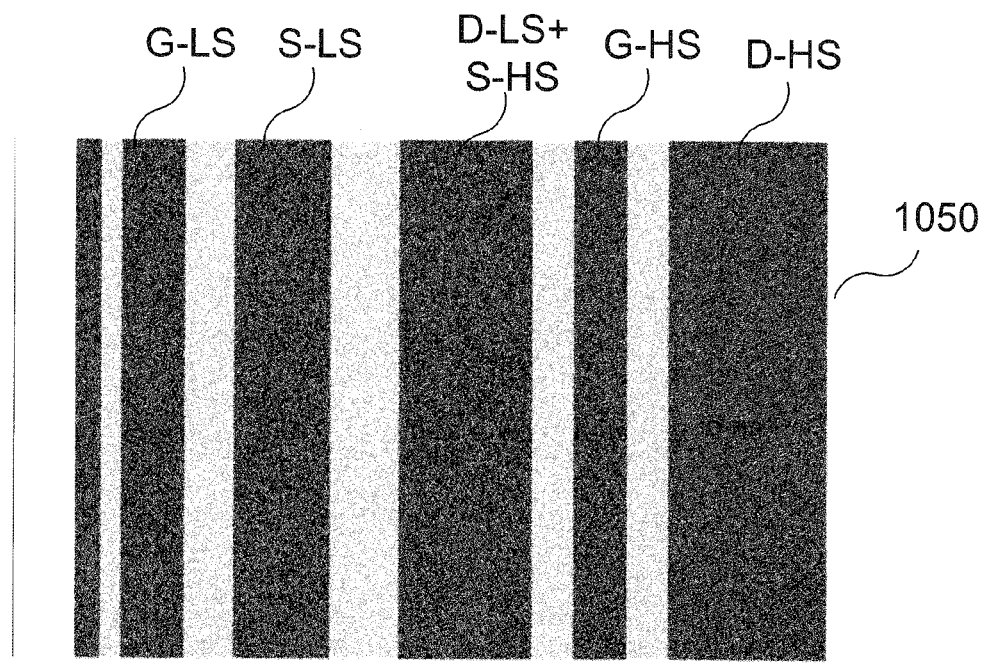
FIG. 11 shows a top view of a chip arrangement according to various embodiments.
Figure 12:
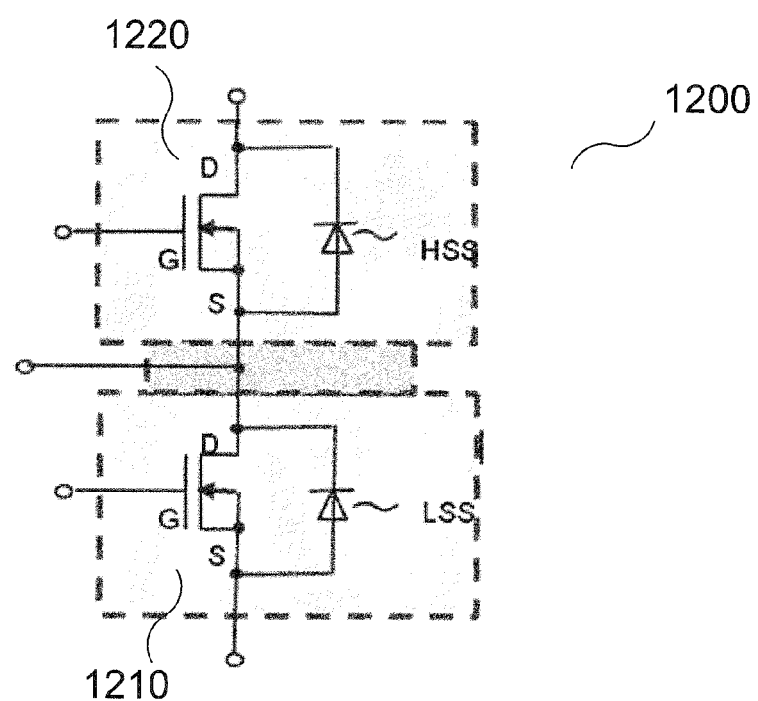
FIG. 12 shows a circuit diagram corresponding to FIG. 10 and FIG. 11.

FIG. 12 shows a circuit diagram 1200, wherein a half bridge circuit corresponding to the chip arrangement 1050 of FIG. 10 and FIG. 11 is shown. The half bridge circuit may include a low side transistor 1210, e.g. the low side chip 1010 of FIG. 10, and a high side transistor 1220, e.g. the high side chip 1020 of FIG. 10, connected serially.

Various embodiments provide a chip arrangement. The chip arrangement may include a first chip having a first chip side and a second chip side opposite the first chip side and at least one contact on its second chip side; a second chip having a first chip side and a second chip side opposite the first chip side and at least one contact on its first chip side; wherein the second chip side of the first chip and the second chip side of the second chip are facing each other; a first electrically conductive structure extending from the at least one contact of the first chip from the second chip side of the first chip through the first chip to the first chip side of the first chip; and a second electrically conductive structure extending from the at least one contact of the second chip from the first chip side of the second chip through the second chip and through the first chip to the first chip side of the first chip.

In various embodiments, the first electrically conductive structure may extend through via holes through the first chip, wherein the sidewalls of the via holes may be covered by an insulating layer. In various embodiments, the second electrically conductive structure may extend through via holes through the first chip and the second chip, wherein the sidewalls of the via holes may be covered by an insulating layer.

In various embodiments, at least one of the first chip and the second chip may include at least one electric circuit. At least one of the first chip and the second chip may include at least one power semiconductor device. Examples of the power semiconductor devices may include but are not limited to power MOSFETs (metal oxide semiconductor field effect transistor), JFETs (junction field effect transistor), IGBTs (insulated gate bipolar transistor), power bipolar transistors, diodes, and the like.

In various embodiments, the first chip may include a diode. In various embodiments, the second chip may include a power transistor, such as an IGBT, or a power MOSFET.

According to various embodiments, the second chip side of the first chip and the second chip side of the second chip may be bonded to each other. In various embodiments, the second chip side of the first chip and the second chip side of the second chip may be bonded to each other by means of wafer bonding, e.g. by means of anodic bonding.

According to various embodiments, the chip arrangement may further include a re-distribution layer disposed over the first chip side of the first chip, wherein at least one of the second electrically conductive structure and the at least one contact of the first chip is electrically coupled to the re-distribution layer.

In various embodiments, the first chip may further include at least one contact on its first chip side. In various embodiments, a third electrically conductive structure may be disposed over the first chip side of the first chip.

In an exemplary embodiment, the first chip may be a power transistor, wherein its gate electrode and source electrode may be formed on its first chip side, and a third electrically conductive structure may be disposed over the first chip side for electrical coupling with the gate electrode and source electrode.

According to various embodiments, the second chip may include at least one further contact on its second chip side. The at least one contact on the second chip side of the first chip and the at least one further contact on the second chip side of the second chip may be arranged relative to each other such that they physically contact each other.

In various embodiments, the chip arrangement may further include a coupling structure between the first chip and the second chip. The coupling structure may include a first structure side and a second structure side opposite the first structure side, and at least one contact on its first structure side and at least one further contact on its second structure side. The at least one contact on the first structure side may be electrically coupled to the at least one contact on the second chip side of the first chip; and the at least one further contact on the second structure side may be electrically coupled to the at least one further contact on the second chip side of the second chip.

In various embodiments, the at least one contact on the first structure side and the at least one further contact on the second structure side may be electrically coupled with each other via the coupling structure.

In various embodiments, the coupling structure may include at least one conductor track. In various embodiments, the coupling structure may include an isolating layer with at least one conductor track embedded therein.

According to various embodiments, the chip arrangement may be configured as a half bridge circuit, e.g. by electrically coupling the respective contacts of the first chip and the second chip accordingly to form a half bridge circuit.

Various embodiments provide a wafer arrangement. The wafer arrangement may include a first wafer having a first wafer side and a second wafer side opposite the first wafer side, and a plurality of first chips. Each first chip may include at least one contact on the second wafer side of the first wafer.

The wafer arrangement may include a second wafer having a first wafer side and a second wafer side opposite the first wafer side, and a plurality of second chips. Each second chip may include at least one contact on the first wafer side of the second wafer.

The second wafer side of the first wafer and the second wafer side of the second wafer may face each other.

The wafer arrangement may further include a first electrically conductive structure extending from the respective at least one contact of the first chip from the second wafer side of the first wafer through the first chip to the first wafer side of the first wafer. The wafer arrangement may further include a second electrically conductive structure extending from the respective at least one contact of the second chip from the first wafer side of the second wafer through the second chip and through the first chip to the first wafer side of the first wafer.

In various embodiments, the first electrically conductive structure may extend through via holes through the first wafer, wherein the sidewalls of the via holes may be covered by an insulating layer. In various embodiments, the second electrically conductive structure may extend through via holes through the first wafer and the second wafer, wherein the sidewalls of the via holes may be covered by an insulating layer.

In various embodiments, at least one of the plurality of first chips and the plurality of second chip may include at least one electric circuit. In various embodiments, at least one of the plurality of first chips and the plurality of second chips may include at least one power semiconductor device. Examples of the power semiconductor devices may include but are not limited to power MOSFETs (metal oxide semiconductor field effect transistor), JFETs (junction field effect transistor), IGBTs (insulated gate bipolar transistor), power bipolar transistors, diodes, and the like.

In various embodiments, at least one first chip may include a diode. In various embodiments, at least one second chip may include a power transistor, such as an IGBT, or a power MOSFET.

According to various embodiments, the second wafer side of the first wafer and the second wafer side of the second wafer may be bonded to each other. In various embodiments, the second wafer side of the first wafer and the second wafer side of the second wafer may be bonded to each other by means of wafer bonding, e.g. by means of anodic bonding.

According to various embodiments, the wafer arrangement may further include a re-distribution layer disposed over the first wafer side of the first wafer, wherein at least one of the second electrically conductive structure and the at least one contact of the respective first chip is electrically coupled to the re-distribution layer.

At least one first chip may further include at least one contact on the first wafer side of the first wafer. A third electrically conductive structure may be disposed over the first wafer side of the first wafer.

The first chip may be a power transistor, wherein its gate electrode and source electrode may be formed on the first wafer side of the first wafer, and a third electrically conductive structure may be disposed over the first wafer side of the first wafer for electrical coupling with the gate electrode and source electrode.

According to various embodiments, at least one second chip may include at least one further contact on the second wafer side of the second wafer. The at least one contact on the second wafer side of the first wafer and the at least one further contact on the second wafer side of the second wafer may be arranged relative to each other such that they physically contact each other.

In various embodiments, the wafer arrangement may further include a coupling structure between the first wafer and the second wafer. The coupling structure may include a first structure side and a second structure side opposite the first structure side, and at least one contact on its first structure side and at least one further contact on its second structure side. The at least one contact on the first structure side may be electrically coupled to the at least one contact on the second wafer side of the first wafer; and the at least one further contact on the second structure side may be electrically coupled to the at least one further contact on the second wafer side of the second wafer.

In various embodiments, the at least one contact on the first structure side and the at least one further contact on the second structure side may be electrically coupled with each other via the coupling structure.

In various embodiments, the coupling structure may include at least one conductor track. In various embodiments, the coupling structure may include an isolating layer with at least one conductor track embedded therein.

According to various embodiments, the wafer arrangement may be configured as a plurality of half bridge circuits, e.g. by electrically coupling the respective contacts of the respective first chip and the respective second chip accordingly to form the respective half bridge circuit.

Various embodiments provide a method of manufacturing a chip arrangement. The method may include providing a first chip having a first chip side and a second chip side opposite the first chip side and at least one contact on its second chip side; providing a second chip having a first chip side and a second chip side opposite the first chip side and at least one contact on its first chip side; arranging the first chip and the second chip such that the second chip side of the first chip and the second chip side of the second chip are facing each other; forming a first electrically conductive structure extending from the at least one contact of the first chip from the second chip side of the first chip through the first chip to the first chip side of the first chip; and forming a second electrically conductive structure extending from the at least one contact of the second chip from the first chip side of the second chip through the second chip and through the first chip to the first chip side of the first chip.

In various embodiments, the method may include bonding the second chip side of the first chip and the second chip side of the second chip to each other, e.g. by means of anodic bonding.

In various embodiments, the method may include disposing a third electrically conductive structure over the first chip side of the first chip, wherein the first chip includes at least one contact on its first chip side.

In various embodiments, the method may include forming a coupling structure between the first chip and the second chip, the coupling layer including a first structure side and a second structure side opposite the first structure side and at least one contact on its first structure side and at least one further contact on its second structure side. The second chip may include at least one further contact on its second chip side. The at least one contact on the first structure side may be electrically coupled to the at least one contact on the second chip side of the first chip; and the at least one further contact on the second structure side may be electrically coupled to the at least one further contact on the second chip side of the second chip.

Various embodiments provide a method of manufacturing a wafer arrangement. The method may include providing a first wafer having a first wafer side and a second wafer side opposite the first wafer side and a plurality of first chips, each first chip including at least one contact on the second wafer side of the first wafer; providing a second wafer having a first wafer side and a second wafer side opposite the first wafer side and a plurality of second chips, each second chip having at least one contact on the first wafer side of the second wafer; arranging the first wafer and the second wafer such that the second wafer side of the first wafer and the second wafer side of the second wafer are facing each other; forming a first electrically conductive structure extending from the respective at least one contact of the first chip from the second wafer side of the first wafer through the first chip to the first wafer side of the first wafer; and forming a second electrically conductive structure extending from the respective at least one contact of the second chip from the first wafer side of the second chip through the second chip and through the first chip to the first wafer side of the first wafer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement, comprising:
   a first chip comprising a semiconductor substrate and having a first chip side and a second chip side opposite the first chip side and at least one contact on its second chip side;
   a second chip comprising a semiconductor substrate and having a first chip side and a second chip side opposite the first chip side and at least one contact on its first chip side;
   wherein the second chip side of the first chip and the second chip side of the second chip are facing each other;
   a first electrically conductive structure extending from the at least one contact of the first chip from the second chip side of the first chip through the first chip to the first chip side of the first chip so that the first electrically conductive structure extends at least through the semiconductor substrate of the first chip; and
   a second electrically conductive structure extending from the at least one contact of the second chip from the first chip side of the second chip through the second chip and through the first chip to the first chip side of the first chip so that the first second conductive structure extends at least through the semiconductor substrates of the first and second chips.

2. The chip arrangement of claim 1,
   wherein at least one of the first chip and the second chip comprises at least one electric circuit.

3. The chip arrangement of claim 1,
   wherein at least one of the first chip and the second chip comprises at least one power semiconductor device.

4. The chip arrangement of claim 1,
   wherein the first chip comprises a diode; and
   wherein the second chip comprises a power transistor.

5. The chip arrangement of claim 1,
   wherein the first chip further comprises at least one contact on its first chip side.

6. The chip arrangement of claim 5, further comprising:
   a third electrically conductive structure disposed over the first chip side of the first chip.

7. The chip arrangement of claim 1,
   wherein the second chip further comprises at least one further contact on its second chip side.

8. The chip arrangement of claim 1,
wherein the first electrically conductive structure extends through via holes through the first chip;
wherein the sidewalls of the via holes are covered by an insulating layer.

9. The chip arrangement of claim 1, further comprising:
a re-distribution layer disposed over the first chip side of the first chip;
wherein at least one of the second electrically conductive structure and the at least one contact of the first chip is electrically coupled to the re-distribution layer.

10. The chip arrangement of claim 1,
configured as a half bridge circuit.

11. A wafer arrangement, comprising:
a first semiconductor wafer comprising first wafer side and a second wafer side opposite the first wafer side, and a plurality of first chips formed with the first semiconductor wafer, each first chip comprising at least one contact on the second wafer side of the first semiconductor wafer;
a second semiconductor wafer comprising first wafer side and a second wafer side opposite the first wafer side, and a plurality of second chips formed with the second semiconductor wafer, each second chip comprising at least one contact on the first wafer side of the second semiconductor wafer;
wherein the second wafer side of the first wafer and the second wafer side of the second wafer are facing each other;
a first electrically conductive structure extending from the respective at least one contact of the first chip from the second wafer side of the first wafer through the first chip and through the first semiconductor wafer to the first wafer side of the first wafer; and
a second electrically conductive structure extending from the respective at least one contact of the second chip from the first wafer side of the second wafer through the second chip, through the second semiconductor wafer and through the first chip to the first wafer side of the first semiconductor wafer.

12. The wafer arrangement of claim 11,
wherein at least one of the plurality of first chips and the plurality of second chips comprises at least one electric circuit.

13. The wafer arrangement of claim 12,
wherein at least one of the plurality of first chips and the plurality of second chips comprises at least one power semiconductor device.

14. The wafer arrangement of claim 12,
wherein at least one first chip comprises a diode; and
wherein at least one second chip comprises a power transistor.

15. The wafer arrangement of claim 12,
wherein at least one second chip further comprises at least one further contact on the second wafer side of the second wafer.

16. The wafer arrangement of claim 15,
wherein the at least one contact on the second wafer side of the respective first chip and the at least one further contact on the second wafer side of the respective second chip are arranged relative to each other such that they physically contact each other.

17. The wafer arrangement of claim 12,
wherein the first electrically conductive structure extends through via holes through the first wafer;
wherein the sidewalls of the via holes are covered by an insulating layer.

18. The wafer arrangement of claim 16,
wherein at least one first chip further comprises at least one contact on the first wafer side of the first semiconductor wafer.

19. The wafer arrangement of claim 12, further comprising:
a re-distribution layer disposed over the first wafer side of the first semiconductor wafer;
wherein at least one of the second electrically conductive structure and the at least one contact of the respective first chip is electrically coupled to the re-distribution layer.

20. The wafer arrangement of claim 12,
wherein the second wafer side of the first semiconductor wafer and the second wafer side of the second semiconductor wafer are bonded to each other.

21. The wafer arrangement of claim 20,
wherein the second wafer side of the first wafer and the second wafer side of the second wafer are bonded to each other by means of anodic bonding.

22. The wafer arrangement of claim 12, further comprising:
a coupling structure between the first wafer and the second wafer, the coupling structure comprising a first structure side and a second structure side opposite the first structure side and at least one contact on its first structure side and at least one further contact on its second structure side;
wherein the at least one contact on the first structure side is electrically coupled to the at least one contact on the second wafer side of the first wafer;
wherein the at least one further contact on the second structure side is electrically coupled to the at least one further contact on the second wafer side of the second wafer.

23. The wafer arrangement of claim 22,
wherein the at least one contact on the first structure side and the at least one further contact on the second structure side are electrically coupled with each other via the coupling structure.

24. The wafer arrangement of claim 22,
wherein the coupling structure comprises at least one conductor track.

25. The wafer arrangement of claim 17,
configured as a plurality of half bridge circuits.

26. The chip arrangement of claim 4,
wherein the diode is formed in the semiconductor substrate of the first chip and the power transistor is formed in the semiconductor substrate of the second chip.

27. The chip arrangement of claim 1,
wherein the first electrically conductive structure extends through a non-device portion of the semiconductor substrate of the first chip, and
wherein the second electrically conductive structure extends through another non-device portion of the semiconductor substrate of the first chip and extends through a non-device portion of the semiconductor substrate of the second chip.

* * * * *